United States Patent
Hoenigschmid et al.

(10) Patent No.: US 6,898,106 B2
(45) Date of Patent: May 24, 2005

(54) USING FERAM/MRAM CELLS HAVING A HIGH DEGREE OF FLEXIBILITY AND COMPACT CONSTRUCTION AND METHOD OF OPERATING THE MEMORY DEVICE

(75) Inventors: Heinz Hoenigschmid, Essex, VT (US); Gerhard Müller, Meitingen (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/458,965

(22) Filed: Jun. 11, 2003

(65) Prior Publication Data

US 2004/0022117 A1 Feb. 5, 2004

Related U.S. Application Data

(63) Continuation of application No. PCT/DE01/04524, filed on Dec. 3, 2001.

(30) Foreign Application Priority Data

Dec. 11, 2000 (DE) .......................................... 100 61 580

(51) Int. Cl.$^7$ .............................................. G11C 11/22
(52) U.S. Cl. ...................................... 365/145; 257/306
(58) Field of Search .......................... 365/145; 257/306

(56) References Cited

U.S. PATENT DOCUMENTS

| | | | |
|---|---|---|---|
| 5,487,032 A | | 1/1996 | Mihara et al. |
| 5,644,151 A | * | 7/1997 | Izumi et al. ................. 257/306 |
| 5,744,832 A | | 4/1998 | Wolters et al. |
| 5,978,250 A | * | 11/1999 | Chung et al. ................ 365/145 |
| 5,995,407 A | | 11/1999 | Kamp |
| 6,094,369 A | | 7/2000 | Ozawa et al. |
| 6,297,986 B1 | * | 10/2001 | Jae Kap ...................... 365/145 |

* cited by examiner

Primary Examiner—Van Thu Nguyen
(74) Attorney, Agent, or Firm—Laurence A. Greenberg; Werner H. Stemer; Ralph E. Locher

(57) ABSTRACT

A memory device is configured to guarantee a high degree of flexibility and a compact construction. To this end, the existing plate line device of the memory device which functions on the basis of a hysteresis process is configured to detect the state of a memory capacitor and hence, the information that is stored.

15 Claims, 4 Drawing Sheets

USING FERAM/MRAM CELLS HAVING A HIGH DEGREE OF FLEXIBILITY AND COMPACT CONSTRUCTION AND METHOD OF OPERATING THE MEMORY DEVICE

CROSS-REFERENCE TO RELATED APPLICATION

This application is a continuation of copending International Application No. PCT/DE01/04524, filed Dec. 3, 2001, which designated the United States and was not published in English.

BACKGROUND OF THE INVENTION

Field of the Invention

The invention relates to a memory device having at least one capacitor device, which is configured for storing information on the basis of a hysteresis process and which has for this purpose a first and a second electrode, first and second terminals connected thereto, and also an influence region with an influence medium provided between the electrodes. At least one transistor device is provided, and is configured for accessing the capacitor device for the purpose of reading and changing the information and which is connected to the capacitor device. At least one plate line device is electrically conductively connected to the capacitor device through a free terminal and is configured for sensing the electromagnetic state of the capacitor device with a sense amplifier device in order to access the information stored there.

In the development of modern memory technologies, it is necessary simultaneously to fulfill different, in part initially conflicting boundary conditions in order to configure an effective memory module which can then also be developed cost-effectively and disseminated commercially. These fundamental requirements relate to the geometrical extent, the switching speeds and also the complexity of the layout that is then to be realized in the semiconductor substrate and forms the basis of the respective memory module or of the individual memory cell.

In memory devices, memory cells are usually disposed in matrix form and are activated by simultaneous addressing via an assigned row or word line and an assigned column or bit line in order to be read from and/or written to. In accordance with the activation, e.g. a capacitor or the like which is configured to store information is then accessed. Conventional access is essentially effected via a transistor which can be connected or is connected to the capacitor, to be precise by a procedure in which, after activation, the information-carrying signal to be read out on the capacitor is detected by a corresponding sense amplifier in the column line or bit line and correspondingly amplified in order then to be forwarded in a manner such that it can be tapped off as an amplified data signal.

Further requirements made of the memory mechanism, in particular the aim of simplifying the memory management and the desire to maintain the memory contents independently of an operating voltage, have motivated so-called nonvolatile memory technologies. The latter are based e.g. essentially on a hysteresis process or effect in the memory element or storage capacitor. These aspects are manifested for example in the development of so-called FeRAM cells, MRAM cells or the like.

Memory cells of the nonvolatile type, in particular FeRAM cells or the like, are usually connected between one of the column lines or bit lines and an additional charging line, also referred to as plate line or "plate". The plate line is usually connected to a driver circuit, which holds the plate line at a predetermined potential. During conventional operation of the memory device, the column lines or bit lines and the charging lines or plate lines of the memory device in each case have an active and an inactive operating mode or corresponding state. In the active operating mode, in which, by way of example, the content of a memory cell is read out, the corresponding column line or bit line is connected to a sense amplifier. The plate line or charging line is at a predetermined potential in this case. In the inactive operating mode, the corresponding column lines or bit lines and the respective charging lines are generally connected to a terminal for a common supply potential, in particular in order to avoid unintentional alterations of the memory content, for example due to disturbances or the like.

Despite these developments, there is still nevertheless the need for a higher integration of the individual memory cells in the semiconductor substrate and for the shortening of switching times. At the same time, overall, for the realization of these concepts, the layout of the respective lines with respect to the individual memory cells in the entire memory module is to be configured with a particularly low area requirement.

SUMMARY OF THE INVENTION

It is accordingly an object of the invention to provide a memory device and a method of operating the memory device that overcome the above-mentioned disadvantages of the prior art devices and methods of this general type, which can be reliably addressed with regard to the memory content and which nonetheless permits a particularly space-saving layout.

With the foregoing and other objects in view there is provided, in accordance with the invention, a memory device. The memory device contains at least one capacitor device for storing information on a basis of a hysteresis process and has a first electrode, a second electrode, first and second terminals connected to the first and second electrodes respectively, and an influence region with an influence medium disposed between the first and second electrodes. At least one transistor device is connected to and accesses the capacitor device for reading and changing the information. A sense amplifier device is provided for sensing an electromagnetic state of the capacitor device for accessing the information stored in the capacitor device. At least one plate line device is electrically conductively connected to one of the first and second terminals of the capacitor device and to the sense amplifier device. A semiconductor substrate and a bit line device are provided. The bit line device and the second electrode of the capacitor device are formed from the same material, and are disposed in a same vertical layer region of the semiconductor substrate.

The apparatus solution provides for the plate line device to be configured for the reading-out or sensing of the capacitor device, in particular of the electromagnetic and/or ferroelectric state thereof, in order to access the information stored there.

The electromagnetic and/or ferroelectric state may be interpreted in particular as a charge state or polarization state. However, a state relating to certain magnetic properties or quantities is also conceivable.

Consequently, a fundamental idea of the present invention, relative to conventional memory devices based on a hysteresis process or effect, is to configure and construct an existing plate line device in such a way that it can serve for the sensing or reading-out of the capacitor device. The sensing or reading-out of the capacitor device is affected by the detection of the respective electromagnetic and/or ferroelectric state of the capacitor device. Overall, then, the plate line device is configured to access the information stored in the capacitor device, whether this is in a reading manner and/or in a writing manner.

Configuring the plate line device for sensing or reading out the memory content relieves the burden on the column line or bit line provided for this purpose in conventional memory devices. Since the bit line is then no longer accorded this task, the result may be a higher flexibility with regard to the layout and the configuration of the bit line in relation to the entire memory module and the simultaneous configuration relative to other bit lines and relative to the word lines. Consequently, the use of the plate line for the sensing or reading-out provides a higher flexibility of the memory device according to the invention in comparison with the prior art. The short switching times and the non-volatility of the memory contents independently of an applied operating voltage are maintained in this case. The increased flexibility results in that a further miniaturization and higher integration of the memory device according to the invention in comparison with the prior art are also conceivable.

In the text above and below a nonvolatile or remanent hysteresis process or effect is to be understood as a preferably electromagnetic and/or ferroelectric process or effect which proceeds or is present in the region of the memory devices that stores the storing information, and relates to the electrical and/or magnetic properties or quantities. Furthermore, a plurality—preferably two—of physical states that can be distinguished from one another can be generated by the process or effect. The states are assigned to specific information contents, which are preserved even after an external operating voltage of the memory device has been switched off. They can be varied preferably essentially only by explicit and active alteration.

In order to ensure and reliably configure a sensing of the capacitor device by the plate line device, in accordance with a preferred embodiment of the memory device according to the invention, it is provided that the plate line device is configured such that it is connected or can be connected to a sense amplifier device by which tapped-off signals can be detected and amplified.

The memory device may be configured in each case essentially as an, in particular elementary, FeRAM cell, MRAM cell or the like.

In the case of an FeRAM cell, the nonvolatile hysteresis process consists in the formation of a nonvolatile polarization between the electrodes of the capacitor device.

Correspondingly, in an MRAM cell, a magnetization state or the like is suitably changed by the nonvolatile hysteresis process. In this case, instead of the capacitor device, an electromagnetic device of this type or a corresponding memory element is then meant, which can be used precisely to generate and/or sense a corresponding magnetic field and/or a magnetization state directly or indirectly.

In accordance with a preferred embodiment of the memory device according to the invention, the capacitor device has at least a first and a second electrode, first and second terminals connected thereto, and also an influence region with an influence medium provided between the electrodes. In this case, the influence region is understood to be a spatial region that is influenced, in particular electromagnetically, for the transfer and read-out of information. On account of the influencing, corresponding electrical and/or magnetic properties or quantities of the medium contained in the influencing or influence region, namely of the influence medium, are likewise influenced. In the case of an FeRAM cell, the influence medium is a ferroelectric dielectric whose polarization state can be changed and/or read out on account of the, in particular electromagnetic, influencing.

This configuration makes it possible to access the electromagnetic, in particular ferroelectric state of the influence medium provided as a memory medium. The information to be stored is represented by this state of the influence medium and can be read out and/or altered e.g. via the two electrodes of the capacitor device.

The transistor device is advantageously configured as a field-effect transistor and has a source region, a drain region and a gate region. These can respectively be electrically conductively connected to first ends of first, second and third terminal regions that are likewise provided. The second end of the first terminal region is configured such that it can be connected to the second terminal of the capacitor device. The access to the capacitor device by the transistor device is realized by this configuration.

In accordance with a further embodiment, a bit line device is provided. The latter can be electrically conductively connected to the drain region of the transistor device via the third terminal region. Preferably, the bit line device is configured to be contact-connected to a plurality of further memory devices during operation.

Furthermore, a word line device is provided. The latter can be electrically conductively connected to the gate region of the transistor device via the second terminal region. The word line device, too, is configured, in particular, to be contact-connected to a plurality of memory devices during operation.

In accordance with a further embodiment of the memory device according to the invention, the influence medium is configured as a ferroelectric medium, in particular made of SBT, $SrBi_2Ta_2O_9$ or the like. Ferroelectric media have particularly favorable hysteresis properties that can be utilized in the construction of so-called FeRAM cells. In the case of an MRAM, a soft-magnetic influence medium, in particular in combination with a hard-magnetic region, is correspondingly advantageous.

For large-scale integration of a multiplicity of memory devices, it is advantageous for the memory device to be configured at least as part of an integrated circuit in a semiconductor substrate or the like.

In this case, it is then particularly preferred for the capacitor device to be configured as a layer construction disposed essentially vertically, in particular on the semiconductor substrate.

Depending on the layout and configuration of a memory module with a multiplicity of memory devices, it is expedient, for the highest possible packing density of memory devices in a confined space, to combine planar/vertical capacitor devices and/or transistor devices with one another or else to depart in greater or lesser form from strict planarity or verticality.

It is furthermore advantageous for the second electrode of the capacitor device and the bit line device to be formed essentially from the same, preferably metallic, material. In this case, it is further preferred for the second electrode of the capacitor device and the bit line device to be formed essentially in the same vertical layer region on the semiconductor substrate.

This affords the advantage that, in the layer-like construction of a memory module containing a plurality of memory devices according to the invention, the previous production process does not have to be fundamentally modified.

The second electrode of the capacitor device of an FeRAM cell, which electrode is often configured as the so-called bottom electrode, is applied made of a metal, preferably made of platinum, to the semiconductor substrate in the context of a specific production stage. The embodiment described makes it possible, at the same time as the application of the second or bottom electrode, also to implement the so-called bit line device or bit line in the same production step on the semiconductor substrate, the use of the same material both affording production engineering advantages and helping to avoid electrochemical problems. There is then no need for an additional and/or deviating metallization layer for the bit line.

The memory device according to the invention is particularly advantageous in terms of production engineering if, in accordance with a further embodiment, the plate line device or plate line is essentially formed on a surface layer region on the semiconductor substrate. In this case, a surface layer region is understood to be e.g. a layer that is disposed essentially on top in the layer construction.

With regard to the flexibility of the layout and the design of a configuration containing a plurality of memory devices according to the invention in a memory module, the configuration of the plate line in a surface region additionally affords the possibility of disentanglement and equalization of the bit lines and word lines that are usually provided. Furthermore, it is then also possible to adopt already existing circuit layouts in a particularly simple manner, in which case the plate line devices can then be virtually placed onto proven layouts in a downstream structuring operation.

An embodiment in which the first electrode of the capacitor device, which first electrode is to be formed anyway, is formed in the region of the plate line device, and in particular as part thereof, is particularly advantageous. Consequently, during the application of the metallization layer for the plate line, the corresponding electrode or capacitor plate for the capacitor device of the FeRAM cell is also produced at the same time.

In terms of the method, the solution according to the invention consists in the fact that, during the method for operating a memory device, in particular a memory device according to the invention, the information of the memory device is read out via a plate line device which is provided in the memory device and, in particular during operation, is connected to a first electrode of the capacitor device of the memory cell. This procedure relieves the burden of this task precisely from the bit line device that is usually associated with the reading-out of the memory content, thus resulting in a higher flexibility and compactness of the layout and also of the memory management.

The method for the operation of the memory device is configured in a particularly advantageous manner if, in accordance with a preferred embodiment thereof, during the reading-out operation, a word line device provided in the memory device and/or a bit line device, for activating the memory device to be read, is stepped up from a relatively low potential value to a relatively high potential value essentially directly before the beginning of the read-out and is stepped down from a relatively high potential value to a relatively low potential value essentially directly after the end of the read-out.

In an advantageous manner, the word line and, in particular, the bit line are stepped up in an essentially pulsed form from a zero potential to corresponding activation potentials, the word line potential preferably being stepped up before the bit line potential and stepped down again after the bit line potential.

The activation of the corresponding memory device with the aid of a pulsed bit line potential can be employed here for the first time advantageously precisely with regard to the memory device according to the invention. This is due to the fact that, as a result of the bit line pulses, overall it is possible to achieve a higher signal level than in conventional memory devices., to be precise with no loss of time. In this case, the time constant T of the rise of the pulse edge is determined as $\tau = R \times C$, where C denotes the total capacitance of the cell array addressed by the lines, namely the sum of the individual cell capacitances connected in parallel and the line capacitance of the bit line, and R denotes the nonreactive resistance of the bit lines which connect the capacitances. In the conventional cell layout with conventional bit lines, the corresponding nonreactive resistances were relatively high. In the memory device according to the invention, however, the bit line, as has already been explained in detail above, is formed in the same vertical layer region as the bottom electrode or bottom capacitor electrode. These are preferably produced from a low-resistance metallic material, in particular made of platinum, as a result of which the nonreactive resistance R of the bit line device can be drastically reduced and a small time constant $\tau$ is thus produced, which actually enables the pulsed operation on the bit line.

Other features which are considered as characteristic for the invention are set forth in the appended claims.

Although the invention is illustrated and described herein as embodied in a memory device and a method of operating the memory device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
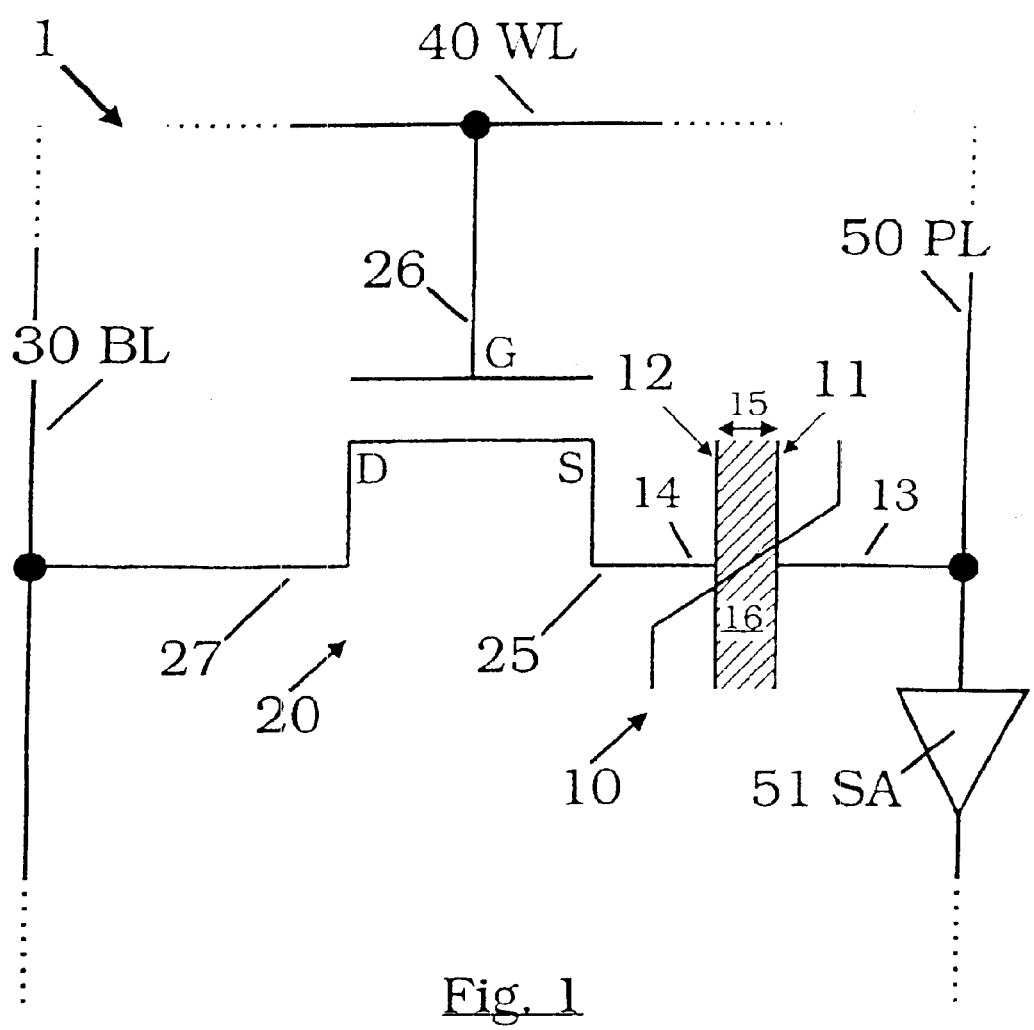
FIG. 1 is a basic circuit diagram for an embodiment of a memory device according to the invention.

Referring now to the figures of the drawing in detail and first, particularly, to FIG. 1 thereof, there is shown diagrammatically a circuit configuration for an embodiment of a memory device 1 according to the invention. The memory device 1 is configured as a so-called FeRAM cell. It has a storage capacitor 10 with a first electrode 11 and a second electrode 12. An influence region 15, which, for its part, is filled with an influence medium 16, is formed between the electrodes 11, 12.

Furthermore, the memory device 1 has a field-effect transistor being an access transistor 20 with a source region S, a drain region D, and a gate region G. Via a first terminal region 25, the source region S of the access transistor 20 is connected to a second terminal 14 of the storage capacitor 10, and in particular to the second electrode 12 thereof, the bottom electrode.

A column or bit line 30 and a row or word line 40 are provided for accessing the memory device 1. The bit line 30 is connected to the drain region D of the access transistor 20 via the third terminal 27. The word line 40 is connected to the gate region G of the access transistor 20 via a second terminal region 26.

In order to access the memory content, which is represented by the electromagnetic, in particular ferroelectric, state of the influence medium 16 in the influence region 15, according to the invention, a plate line 50 is connected to a sense amplifier device 51 (SA), which identifies the tapped-off signal and amplifies it for forwarding purposes. The plate line 50 is connected to the first electrode 11, the top electrode, of the storage capacitor 10 via the first terminal 13 thereof.

Figure 2:
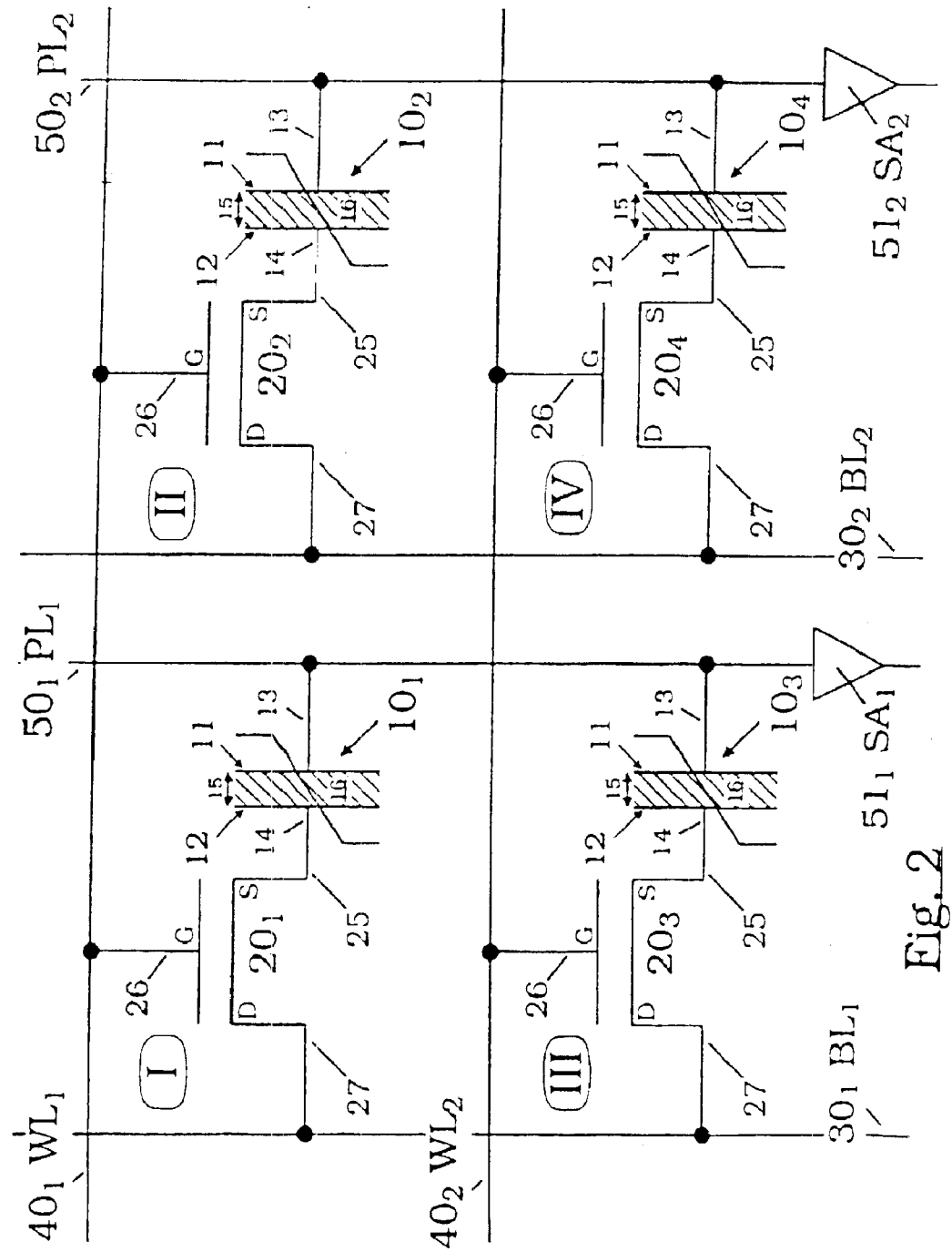
FIG. 2 is a basic circuit diagram of a plurality of identical memory devices according to the invention in a memory cell array.

FIG. 2 shows, in the form of a schematic circuit diagram, the configuration of a cell array 100 having a plurality—namely four—of connected-up memory devices I to IV according to the invention, which have an identical construction. Each of the connected-up memory cells I to IV according to the invention has, as FeRAM cell, a storage capacitor $10_1, \ldots, 10_4$ respectively accessed by access transistors $20_1, \ldots, 20_4$. The access transistors $20_1, \ldots, 20_4$ are addressed and activated via word lines $40_1$ and $40_2$ and bit lines $30_1$ and $30_2$. The storage capacitors $10_1, \ldots, 10_4$ are connected to the plate line $50_1$ or $50_2$ by one respective terminal and to the respective access transistor $20_1, \ldots, 20_3$ by their other electrode. The plate lines $50_1$ and $50_2$ have sense amplifiers $51_1$ and $51_2$ for sensing, detecting and amplifying the signals tapped off.

Figure 3:
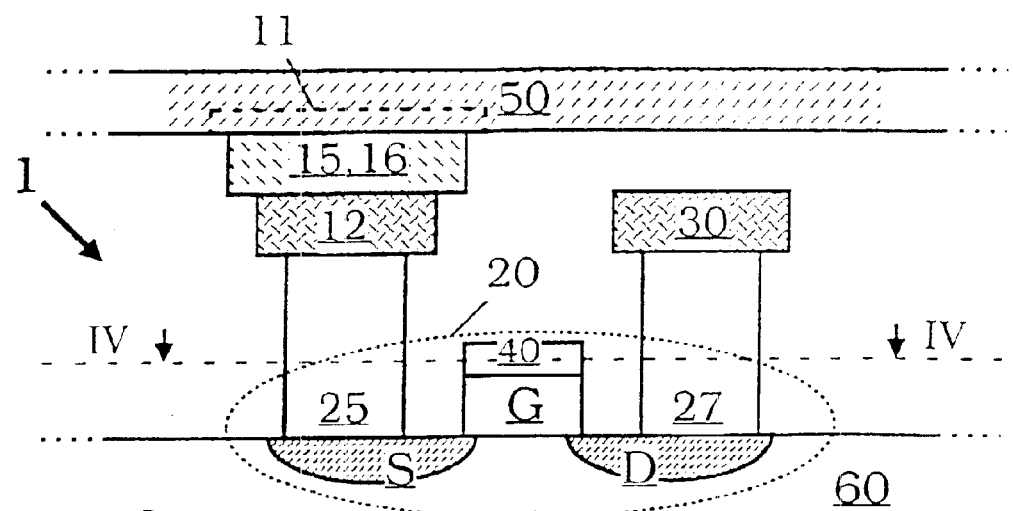
FIG. 3 is a diagrammatic, cross-sectional view of a configuration of an embodiment of the memory device according to the invention in a semiconductor substrate.

FIG. 3 shows, in the form of a sectional illustration, the configuration of an embodiment of the memory device 1 according to the invention on a semiconductor substrate 60.

In an upper region of the semiconductor substrate 60, the source region S and the drain region D of the access transistor 20 are formed for example as n$^+$-doped regions in the semiconductor substrate 60. In the layer applied above that, on the semiconductor substrate 60, first the gate region G of the access transistor 20 is formed in the center. There is applied directly on this a layer which, for its part, forms the so-called word line 40, which extends laterally in the semiconductor substrate 60, that is to say into the plane of the drawing of FIG. 2.

The source region S and the drain region D are adjoined by the first and a third terminal region 25 and 27, respectively, e.g. in the form of so-called plugs. The latter are connected to the bottom or second electrode 12 of the capacitor 10 and to the bit line 30, respectively. It is evident that the bottom or second electrode 12 of the capacitor 10 and the bit line 30 are produced from the same material, namely platinum, and are structured in the same layer region on a semiconductor substrate 60. In this case, the bit line 30 may, if appropriate, also be routed as a diffusion region or the like.

The influence region 15 provided with the influence medium 16 is formed above the bottom or second electrode 12 of the capacitor 10. Above the influence region 15, the so-called plate line 50 extends from left to right in the form of an applied metallization layer, the plate line 50 also simultaneously forming the top or first electrode 11 of the capacitor 10 and being connected to the sense amplifier 51.

Figure 4:
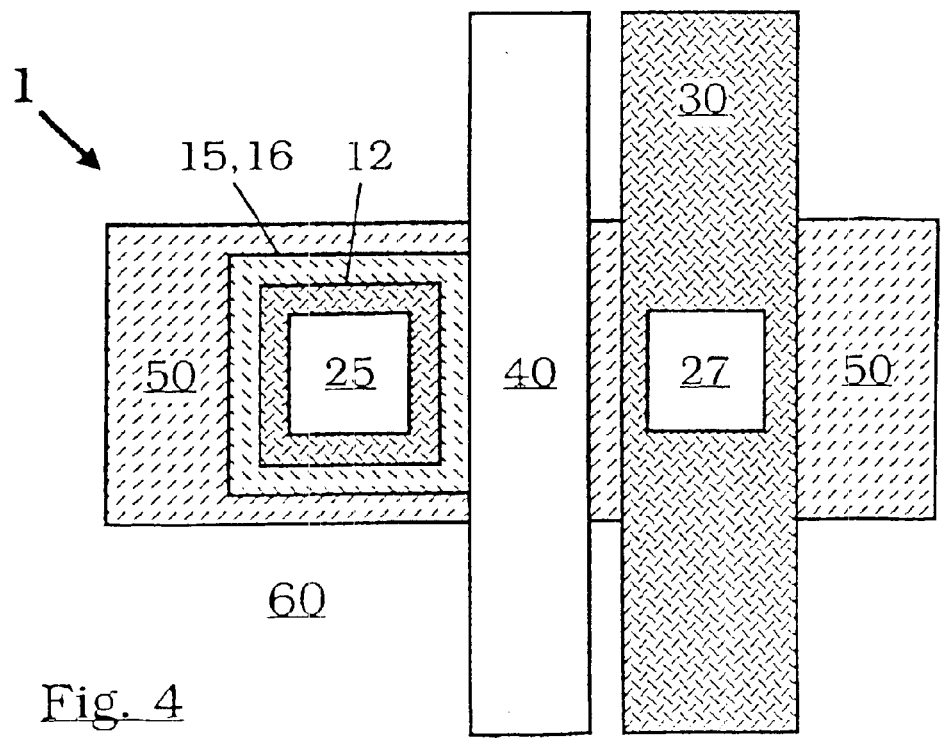
FIG. 4 is a plan view of the layout with respect to the cross-sectional illustration from FIG. 3.

FIG. 4 shows a layout plan view of the configuration from FIG. 3, to be precise along the sectional line IV—IV shown in FIG. 3.

It becomes clear in the relationship between FIGS. 3 and 4 that the word line 40 and the bit line 30 run approximately parallel to one another, to be precise in different layer regions on the semiconductor substrate 60. The plate line 50 runs transversely with respect thereto, to be precise, in the exemplary embodiment shown in FIGS. 3 and 4, in a layer region disposed right at the top on the semiconductor substrate 60.

Figure 5A:
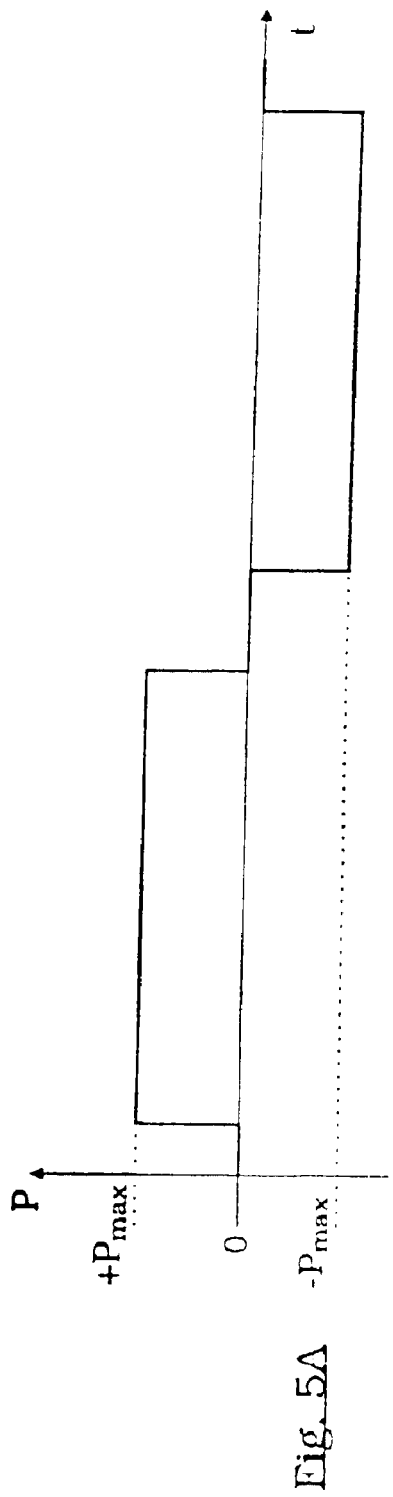
FIGS. 5A and 5B are graphs elucidating an operating method for reading/writing on the memory device according to the invention.
Figure 5B:
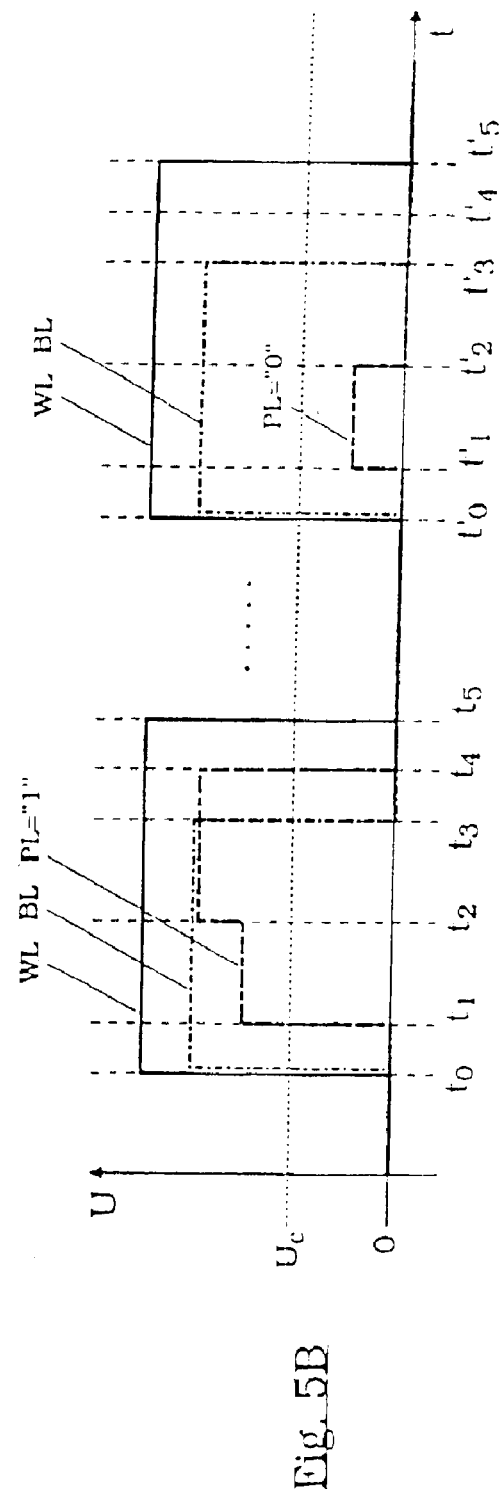

FIGS. 5A and 5B show, in the form of graphs, the temporal profiles of various signals which occur in an embodiment of the memory device according to the invention and from which a possible operating mode of the memory device according to the invention becomes clear.

FIG. 5A shows the temporal profile of the electromagnetic or ferroelectric state, namely of an electrical polarization P of the influence medium 16 of the storage capacitor 10 of the memory device 1 according to the invention. The memory content "0" or "1" shall be realized by definition depending on the polarization P of the influence medium 16 in the influence region 15 of the capacitor 10. The polarization P varies with time t, so that a logic "1" is represented in a first time region and a logic "0" is represented in a second time region.

FIG. 5B shows the temporal profiles of the voltages WL (word line voltage), BL (bit line voltage) and PL (plate line voltage) of the word line 40, of the bit line 30 and of the plate line 50 of the memory device 1 according to the invention.

At instant $t_0$, the memory device 1 according to the invention is activated for reading-out by stepping up the word line voltage WL and the bit line voltage BL. The signal level influenced by the polarization state P of the influence medium 16 then develops in a temporally offset manner at the instant $t_1$, the beginning of the signal development, on the plate line 50. In comparison with a comparison level $U_c$, an increased level results on account of the polarization P, and the plate line voltage PL is set "high" at the instant $t_2$, the instant of sensing and amplification, by the sense amplifier 51, which corresponds to the memory content "1". At the instant $t_3$, the bit line BL is deactivated in order to rewrite the information read to the memory cell again. The rewriting process is ended with the switching-off of the amplifier at $t_4$. At the instant $t_5$, the memory cell is deactivated with the switching-off of the word line voltage WL, but the information content in the influence medium 16 is preserved on account of the nonvolatile hysteresis process.

For the subsequent operating section, it is assumed that the influence medium 16 is in the opposite polarization state P, as a result of which a logic "0" is represented as the memory content.

At the instant $t'_0$, the memory device 1 according to the invention is again activated by stepping up the word line voltage WL and the bit line voltage BL. In a manner somewhat delayed temporally, at the instant $t'_1$, the signal level on the plate line 50 is then read out, which signal level is again influenced by the polarization state P of the influence medium 16. On account of the opposite polarization (representing a "0" state), the signal level falls below the comparison voltage $U_c$ and is then set "low" at the instant $t'_2$ by the sense amplifier, as a result of which a logic "0" appears as a corresponding value on the plate line 50.

What is essential about the procedure during the operation of the memory device according to the invention is, inter alia, that a temporally temporary stepping-up of the bit line 30 with the corresponding bit line signal BL is possible during the read-out of the stored information from the memory device 1 according to the invention.

The pulsed operation affords advantages with regard to the time to be spent and also from an organizational standpoint and is possible here for the first time because the bit line 30 is formed from the same material as the bottom second electrode 12 of the capacitor 10. It is actually the low-resistant configuration of the bit line 30 that advantageously enables pulsed operation on the bit line 30.

To summarize, what emerge as a few essential aspects of the memory device according to the invention and of the method for the operation of a memory device are that an existing plate line device is configured for sensing or reading out the information of the storage capacitor or the like and, for this purpose, is connected in particular to a corresponding sense amplifier, that, moreover, the existing bit line device is embodied approximately in the same vertical layer region of the bottom capacitor electrode or bottom electrode and/or from the same material as the bottom electrode. The layout and the material configuration give rise to the possibility of pulsed operation, in particular on the bit line device, to be precise with no loss of time through reduction of the time constant of the rising edge of the bit line potential pulse by the bit line device configured with a correspondingly low resistance.

We claim:

1. A memory device, comprising:
   at least one capacitor device for storing information on a basis of a hysteresis process and having a first electrode, a second electrode, first and second terminals connected to said first and second electrodes respectively, and an influence region with an influence medium disposed between said first and second electrodes;
   at least one transistor device connected to and accessing said capacitor device for reading and changing the information;
   a sense amplifier device for sensing an electromagnetic state of said capacitor device for accessing the information stored in said capacitor device;
   at least one plate line device electrically conductively connected to one of said first and second terminals of said capacitor device and to said sense amplifier device;
   a semiconductor substrate; and
   a bit line device, said bit line device and said second electrode of said capacitor device formed from a same material, and disposed in a same vertical layer region of said semiconductor substrate;
   said first electrode of said capacitor device being formed in a region of said plate line device.

2. The memory device according to claim 1, wherein the memory device is an FeRAM cell or an MRAM cell.

3. The memory device according to claim 1, wherein said transistor device is a field-effect transistor with a source region, a gate region, a drain region, and first, second and third terminal regions, said first, second and third terminal regions having first ends electrically conductively connected to said source region, said drain region and said gate region, respectively, said first terminal region having a second end connected to said second terminal of said capacitor device.

4. The memory device according to claim 3, wherein said bit line device is electrically conductively connected to said drain region of said transistor device through said third terminal region, said bit line device configured for being contact-connected to a plurality of further memory devices during operation.

5. The memory device according to claim 1, further comprising a word line device electrically conductively connected to said gate region of said transistor device through said second terminal region, said word line device configured for being contact-connected to a plurality of further memory devices during operation.

6. The memory device according to claim 1, wherein said influence medium is a ferroelectric medium.

7. The memory device according to claim 1, wherein the memory device is a part of an integrated circuit.

8. The memory device according to claim 1, wherein said plate line device is formed in a surface layer region on said semiconductor substrate.

9. A memory device, comprising:
   at least one capacitor device for storing information on a basis of a hysteresis process and having a first electrode, a second electrode, first and second terminals connected to said first and second electrodes respectively, and an influence region with an influence medium disposed between said first and second electrodes;
   at least one transistor device connected to and accessing said capacitor device for reading and changing the information;
   a sense amplifier device for sensing an electromagnetic state of said capacitor device for accessing the information stored in said capacitor device;
   at least one plate line device electrically conductively connected to one of said first and second terminals of said capacitor device and to said sense amplifier device;
   a semiconductor substrate; and
   a bit line device, said bit line device and said second electrode of said capacitor device formed from a same material, and disposed in a same vertical layer region of said semiconductor substrate;
   said first electrode of said capacitor device being formed as a part of said plate line device.

10. The memory device according to claim 1, wherein said influence medium is selected from the group consisting of SBT and $SrBi_2Ta_2O_9$.

11. The memory device according to claim 1, wherein said transistor device, said capacitor device, said plate line device, and said bit line device are supported by said semiconductor substrate.

12. A memory device, comprising:
    at least one capacitor device for storing information on a basis of a hysteresis process and having a first electrode, a second electrode, first and second terminals connected to said first and second electrodes respectively, and an influence region with an influence medium disposed between said first and second electrodes;
    at least one transistor device connected to and accessing said capacitor device for reading and changing the information;
    a sense amplifier device for sensing an electromagnetic state of said capacitor device for accessing the information stored in said capacitor device;
    at least one plate line device electrically conductively connected to one of said first and second terminals of said capacitor device and to said sense amplifier device;
    a semiconductor substrate; and
    a bit line device, said bit line device and said second electrode of said capacitor device formed from a same material, and disposed in a same vertical layer region of said semiconductor substrate;

said capacitor device being formed as a layered construction disposed substantially vertically.

13. The memory device according to claim 1, wherein said material forming said bit line device and said second electrode is a metallic material.

14. A method of operating a memory device, which comprises the steps of:

stepping up from a relatively low potential value to a relatively high potential value at least one of a word line device and a bit line device substantially directly before a beginning of a reading-out process for activating the memory device according to claim 1 to be read; and stepping down from the relatively high potential value to the relatively low potential value at least one of the word line device and the bit line device substantially directly after an end of the reading-out process.

15. A method of operating a memory device, which comprises the steps of:

stepping up from a zero potential to a corresponding activation potential in a substantially pulsed form a word line device and a bit line device in a memory device according to claim 1, during the stepping up step a word line potential being stepped up before a bit line potential; and stepping down the word line potential after the bit line potential has been stepped down.

* * * * *